United States Patent
Lin et al.

(10) Patent No.: US 9,858,378 B2
(45) Date of Patent: Jan. 2, 2018

(54) SYSTEM FOR AND METHOD OF DESIGNING AN INTEGRATED CIRCUIT

(71) Applicant: TAIWAN SEMICONDUCTOR MANUFACTURING COMPANY, LTD., Hsinchu (TW)

(72) Inventors: Wan-Yen Lin, Kaohsiung (TW); Shu-Yu Chen, Hsinchu (TW); Yu-Ti Su, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 220 days.

(21) Appl. No.: 14/510,770

(22) Filed: Oct. 9, 2014

(65) Prior Publication Data

US 2016/0103942 A1     Apr. 14, 2016

(51) Int. Cl.
*G06F 17/50* (2006.01)

(52) U.S. Cl.
CPC ............... *G06F 17/5081* (2013.01)

(58) Field of Classification Search
CPC .................. G06F 17/5036; G06F 17/5081
See application file for complete search history.

(56) References Cited

U.S. PATENT DOCUMENTS

| | | | | |
|---|---|---|---|---|
| 2011/0016440 A1* | 1/2011 | Bergmann | .......... | G06F 17/5036 716/106 |
| 2011/0185332 A1* | 7/2011 | Gauthier, Jr. | ....... | G06F 17/5036 716/133 |
| 2013/0042218 A1* | 2/2013 | Tsai | .................... | G06F 17/5063 716/136 |
| 2015/0135157 A1* | 5/2015 | Lin | .................... | G06F 17/5068 716/137 |

* cited by examiner

*Primary Examiner* — Vuthe Siek
(74) *Attorney, Agent, or Firm* — Hauptman Ham, LLP

(57) ABSTRACT

A method of designing an integrated circuit, that includes receiving a first list corresponding to at least one circuit component in a layout, generating a condensed layout from the layout and performing an electrostatic discharge (ESD) check of the condensed layout. The condensed layout is generated by a processor. The ESD check is configured to verify compliance with one or more ESD design rules. The condensed layout includes at least one circuit component. The at least one circuit component includes an ESD circuit and an associated ESD current path.

20 Claims, 12 Drawing Sheets

SYSTEM FOR AND METHOD OF DESIGNING AN INTEGRATED CIRCUIT

BACKGROUND

The recent trend in miniaturizing integrated circuits has resulted in smaller devices which consume less power yet provide more functionality at higher speeds than before. The miniaturization process has also resulted in stricter design and manufacturing specifications. Various electronic design automation (EDA) tools are developed to generate, optimize and verify designs for semiconductor devices while ensuring that the design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
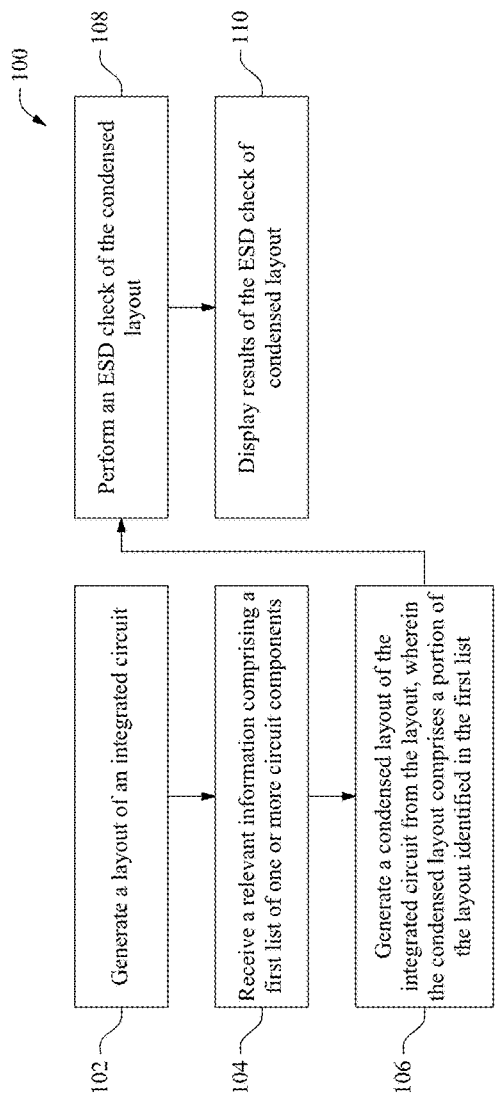
FIG. 1A is a flow chart of a method of designing an integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of designing an integrated circuit, the method includes generating, by a processor, a layout of the integrated circuit, receiving a relevant information, generating a condensed layout of the integrated circuit from the layout, performing an ESD check of the condensed layout, and displaying a result of the ESD check. The relevant information includes a first list of one or more circuit components of the plurality of circuit components in the layout. The integrated circuit includes a plurality of circuit components. The first list includes an ESD circuit and an associated ESD current path. The condensed layout includes a portion of the layout identified in the first list. The ESD check is configured to verify compliance with one or more ESD design rules.

FIG. 1A is a flow chart of a method 100 of designing an integrated circuit in accordance with some embodiments. In some embodiments, the method 100 is implemented as a software application including computer program code for execution by a processor that is used by an EDA tool.

Method 100 begins with operation 102, in which a system for designing an integrated circuit generates a layout of an integrated circuit. The layout is a physical location of the devices and connections in a schematic design. In some embodiments, the layout is generated using a graphic database system (GDS). In some embodiments, the layout includes multiple layers. In some embodiments, generating the layout includes designing masks which are used to pattern a wafer to form the integrated circuit. In some embodiments, a number of masks are equal to a number of layers in the layout. In some embodiments, more than one mask is used to form at least one layer of the layout. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on a schematic design of the integrated circuit. In some embodiments, the integrated circuit comprises a plurality of circuit components.

In operation 104, the system for designing an integrated circuit receives a relevant information. In some embodiments, the relevant information comprises layer information of the integrated circuit or one or more selected features of the integrated circuit. In some embodiments, the layer information comprises a specific layer number of the integrated circuit. In some embodiments, the specific layer number of the integrated circuit identifies one or more circuit components of the plurality of circuit components in the layout on the layer number. In some embodiments, the relevant information comprises a first list of one or more circuit components of the plurality of circuit components in the layout. In some embodiments, the one or more circuit components comprise back end of line (BEOL) components.

In some embodiments, the relevant information is input by a user of the EDA tool on which method 100 is stored. In some embodiments, the EDA tool includes a user interface (such as the one shown as interface 700 in FIG. 7). In some embodiments, the user interface is a computer interface configured to display or control the method 100 of designing an integrated circuit. In some embodiments, the user interface is configured to receive the relevant information from a user. In some embodiments, the user interface is also configured to receive user inputs to adjust the relevant information of the integrated circuit.

In some embodiments, the first list comprises an ESD circuit and a corresponding ESD current path. In some embodiments, the ESD circuit is associated with a corresponding ESD current path. In some embodiments, the ESD circuit is associated with a plurality of corresponding ESD current paths.

In some embodiments, the ESD circuit includes one or more diodes, one or more resistors, one or more clamp circuits or one or more transistors. In some embodiments, the ESD circuit includes one or more pads, one or more voltage sources VDD or one or more ground voltage references VDD.

In some embodiments, a diode includes a gated diode. In some embodiments, a diode includes a dummy diode. In some embodiments, one or more diodes are located between a pad and a voltage source VDD. In some embodiments, one or more diodes are located between a pad and a ground reference voltage VSS. In some embodiments, a diode includes one more oxide definition (OD) layers, one or more polysilicon layers, one or more n-type implanted regions on one or more layers and one or more p-type implanted regions on one or more layers. In some embodiments, a pad is an input pad. In some embodiments, a pad is an output pad.

In some embodiments, a clamp circuit is a dynamic clamp or a static clamp. In some embodiments, a clamp circuit comprises one or more diodes. In some embodiments, a clamp circuit comprises one or more transistors. In some embodiments, a clamp circuit is an ESD power clamp circuit located between the power busses. In some embodiments, a clamp circuit is an ESD power clamp circuit located between a voltage source VDD and a ground reference voltage VSS. In some embodiments, a clamp circuit is configured to protect the internal circuitry of the integrated circuit. In some embodiments, a clamp circuit includes one more OD layers, one or more polysilicon layers, one or more n-type implanted regions on one or more layers, one or more dummy layers for ESD design rule check (DRC).

In some embodiments, a transistor includes an n-type metal oxide semiconductor (NMOS) transistor. In some embodiments, a transistor includes a p-type metal oxide semiconductor (PMOS) transistor. In some embodiments, an NMOS transistor includes one more OD layers, one or more polysilicon layers, one or more n-type implanted regions on one or more layers, one or more dummy layers for ESD DRC.

In some embodiments, an ESD current path is associated with a corresponding ESD circuit. In some embodiments, a plurality of ESD current paths is associated with a corresponding ESD circuit.

In some embodiments, an ESD current path is a conductive path between two or more locations in an integrated circuit where an electrostatic discharge occurs. In some embodiments, an ESD current path is between a pad and a voltage source VDD. In some embodiments, an ESD current path is between a pad and a ground reference voltage VSS. In some embodiments, an ESD current path is between an input pad and an output pad.

In operation 106, the system for designing the integrated circuit generates a condensed layout of the integrated circuit from the layout. In some embodiments, the condensed layout comprises a portion of the layout identified in the first list. In some embodiments, the condensed layout does not include items in the layout that are not identified in the first list. In some embodiments, the number of circuit components in the condensed layout is less than the number of circuit components in the layout. In some embodiments, the condensed layout only includes each of the circuit components identified in the first list.

The condensed layout is a physical location of the devices and connections in the schematic design. In some embodiments, the condensed layout is generated using GDS. In some embodiments, the condensed layout includes multiple layers. In some embodiments, the condensed layout is stored on a non-transitory computer readable medium. In some embodiments, the condensed layout is generated using a tool which is also configured to design an integrated circuit (e.g., method 100). In some embodiments, the condensed layout is generated using a tool such as VIRTUOSO® available from CADENCE DESIGN SYSTEMS, Inc., or another suitable layout generating tool. In some embodiments, the condensed layout is generated based on a netlist which is created based on the schematic design of the integrated circuit.

In operation 108, the system for designing the integrated circuit performs an ESD check of the condensed layout. In some embodiments, the ESD check is utilized to verify compliance with one or more corresponding ESD design rules. In some embodiments, the ESD design rules are part of an ESD rule deck. In some embodiments, the ESD rule deck specifies the ESD design rules to be checked. In some embodiments, the ESD design rules include minimum width and thickness dimensions of conductive structures in the condensed layout so that the conductive structures do not burn out from a current on the conductive structure. In some embodiments, the ESD rules define the maximum allowed resistance between various structures such as a pad to a clamp circuit, one clamp circuit to another; or one pad to another pad.

In some embodiments, the ESD check verifies compliance with a human body model (HBM) or a charged device model (CDM). In some embodiments, the ESD check includes a current density check which is configured to generate current density and ESD electro-migration maps. In some embodiments, for the current density check, the current-voltage (I-V) curves of diodes/clamps and the peak ESD electro-migration (EM) limits for metal/via layers are input into the EDA device. In some embodiments, the ESD check includes an RC extraction process. In some embodiments, the RC extraction extracts electrical performance information from the condensed layout. In some embodiments, the RC extraction is performed based on an extracted condensed layout netlist. In some embodiments, the RC extraction applies the extracted information to various device models to determine the electrical characteristics of the condensed layout generated in operation 106. The RC extraction accounts for both the active devices and interconnect structures used to connect various active devices together.

In some embodiments, a same tool used to generate the condensed layout is used to perform the ESD check. In some embodiments, ESD check is performed by a separate tool following generation of the condensed layout.

In operation 110, the system for designing the integrated circuit displays a result of the ESD check. In some embodiments, a result of the ESD check includes a pass or failure of one or more ESD design rules and a corresponding location of the pass or failure of the one or more ESD design rules. In some embodiments, the results are displayed by a user interface (such as the one shown as interface 700 in FIG. 7). In some embodiments, method 100 is repeated to further condense or reduce the number of circuit elements contained in the condensed layout.

Figure 1B:
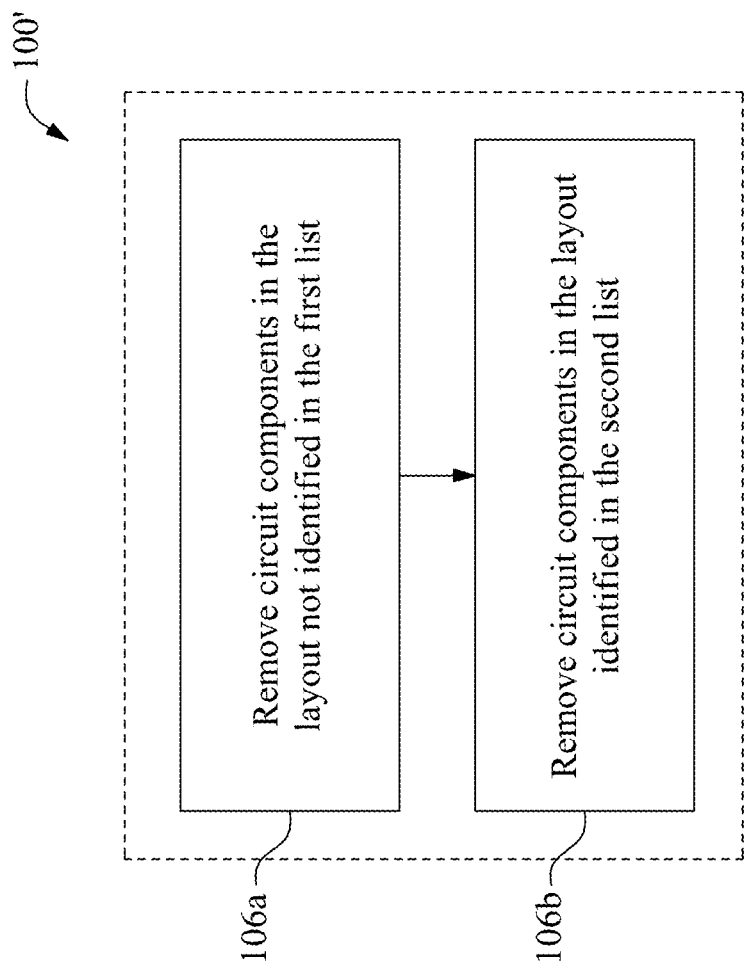
FIG. 1B is a flow chart of a method of generating a condensed layout of the integrated circuit in accordance with some embodiments.

FIG. 1B is a flow chart of a method 100' of generating a condensed layout of the integrated circuit from the layout in accordance with some embodiments. In some embodiments, the method 100' is implemented as a software application including computer program code for execution by a processor that is used by an EDA tool. Method 100' is an embodiment of operation 106 shown in FIG. 1A.

Method 100' begins with operation 106a in which the system for designing the integrated circuit removes circuit components in the layout of the integrated circuit that are not identified in the first list. In some embodiments, the items identified in the first list are not removed from the layout during operation 106a.

In operation 106b, the system for designing the integrated circuit removes circuit components in the layout of the integrated circuit that are identified in a second list. In some embodiments, the first list comprises a second list. In some embodiments, the second list comprises one or more layers of circuit elements identified in the first list. In some embodiments, the second list is an empty set. In some embodiments, operation 106b is optional, for example, if the second list is an empty set.

In some embodiments, each of the items in the second list is checked by operation 106b such that the condensed layout does not contain circuit components that are included in the second list. In some embodiments, after method 100', the condensed layout includes items identified in the first list that are not in the second list. In some embodiments, if the second list and the first list include one or more common items, then the one or more common items are removed from the condensed layout during operation 106b.

In some embodiments, method 100' is repeated to further condense or reduce the number of circuit elements contained in the condensed layout. In some embodiments, if method 100' is repeated to further condense the condensed layout, then method 100 is also repeated with the condensed layout being utilized as the generated layout in operation 102, and the relevant information received during operation 104 is utilized to further condense the layout.

Figure 2A:
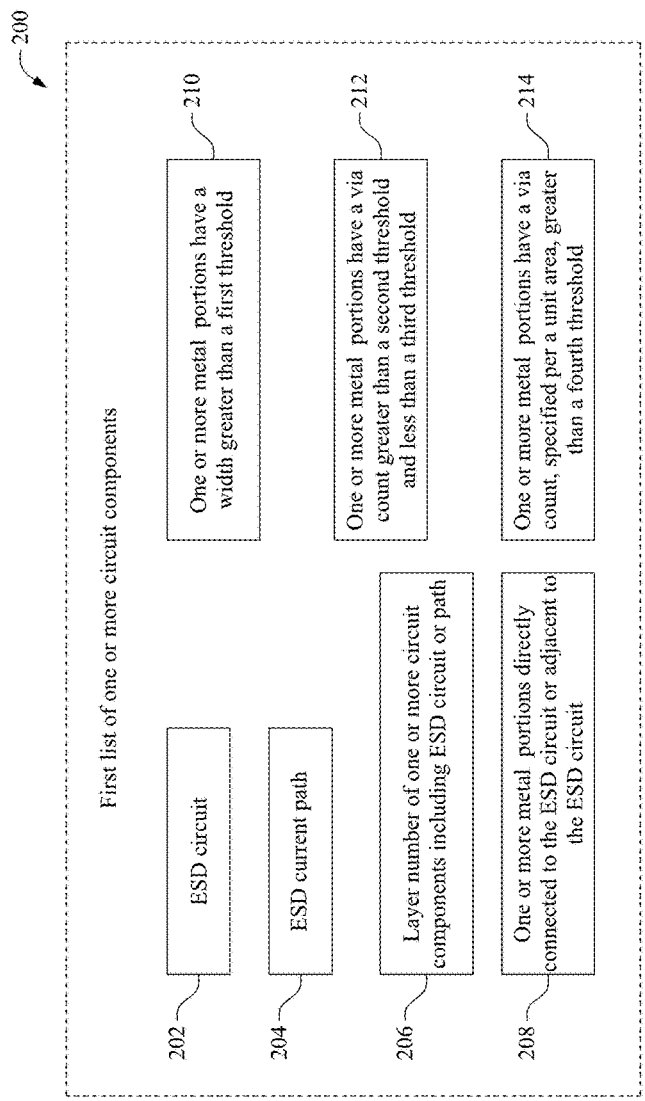
FIG. 2A is a schematic diagram of a first list of one or more circuit components not removed in operation 106a in generating a condensed layout of an integrated circuit in accordance with some embodiments.

FIG. 2A is a schematic diagram of a first list 200 of one or more circuit components not removed in operation 106a in generating a condensed layout of an integrated circuit in accordance with some embodiments.

First list 200 is a list of items or circuit components of the plurality of circuit components in the layout checked by operation 106a in method 100'. In some embodiments, the items identified in first list 200 are related to ESD of an integrated circuit are not removed by method 100. In some embodiments, the items identified in first list 200 are not removed from the layout during operation 106a. In some embodiments, the items in the layout that are not identified in first list 200 are removed from the layout during operation 106a. In some embodiments, each of the items in first list 200 is checked by operation 106a and the condensed layout contains circuit components that are included in first list 200. In some embodiments, each of the items in first list 200 is checked by operation 106a and the condensed layout does not contain circuit components that are not included in first list 200. In some embodiments, first list 200 is received as relevant information in operation 104. In some embodiments, first list 200 is stored on a non-transitory computer readable medium.

First list 200 comprises an item 202, an item 204, an item 206, an item 208, an item 210, an item 212 and an item 214.

Item 202 comprises an ESD circuit. In some embodiments, in generating the condensed layout, operation 106a of method 100' does not remove item 202 from the layout. In some embodiments, item 202 includes a plurality of ESD circuits. In some embodiments, in generating the condensed layout, operation 106a of method 100' does not remove one or more ESD circuits (e.g., item 202) from the layout.

Item 204 comprises an ESD current path. In some embodiments, an ESD current path is associated with a corresponding ESD circuit. In some embodiments, a plurality of ESD current paths is associated with a corresponding ESD circuit. In some embodiments, in generating the condensed layout, operation 106a of method 100' does not remove item 204 from the layout. In some embodiments, item 204 includes a plurality of ESD paths. In some embodiments, in generating the condensed layout, operation 106a of method 100' does not remove one or more ESD paths (e.g., item 204) from the layout.

Item 206 comprises a layer number of one or more circuit components. In some embodiments, item 206 comprises a layer number of an ESD circuit, wherein the ESD circuit is located on the corresponding layer number. In some embodiments, item 206 comprises a layer number of an ESD current path, wherein the ESD current path is located on the corresponding layer number. In some embodiments, item 206 includes a plurality of layers.

In some embodiments, in generating the condensed layout, operation 106a of method 100' does not remove item 214 from the layout. In some embodiments, one or more ESD circuits (e.g., item 202) are specified by a corresponding layer number (e.g., item 206) as relevant information in operation 104 of method 100. In some embodiments, one or more ESD paths (e.g., item 204) are specified by a corresponding layer number (e.g., item 206) as relevant information in operation 104 of method 100. In some embodiments, in generating the condensed layout, operation 106a of method 100' does not remove one or more ESD circuits (e.g., item 202) which are specified by a corresponding layer number or one or more ESD paths (e.g., item 204) which are specified by a corresponding layer number from the layout.

Item 208 comprises one or more metal portions directly connected to the ESD circuit or adjacent to the ESD circuit. In some embodiments, item 208 includes one or more metal portions directly connected to a plurality of ESD circuits or adjacent to the plurality of ESD circuits. An adjacent metal portion is a metal portion within a predetermined distance of one or more ESD circuits in the layout. In some embodiments, in generating the condensed layout, operation 106a of method 100' does not remove item 208 from the layout. In some embodiments, in generating the condensed layout, operation 106a of method 100' does not remove one or more metal portions directly connected to each of the ESD circuits or adjacent to each of the ESD circuits from the layout.

Item 210 comprises one or more metal portions having a width greater than a first threshold. In some embodiments, the first threshold is specified by the relevant information in operation 104 of method 100. In some embodiments, in generating the condensed layout, operation 106a of method 100' does not remove item 210 from the layout. In some embodiments, one or more metal portions having a width less than the first threshold are not related to ESD (e.g., method 100) and therefore are removed in operation 106a from the layout in generating the condensed layout. In some embodiments, one or more metal portions having a width greater than the first threshold are related to ESD (e.g., method 100) and therefore are not removed in operation 106a from the layout in generating the condensed layout.

Item 212 comprises one or more metal portions having a via count greater than a second threshold T2, and a via count less than a third threshold T3. In some embodiments, the second threshold T2 is less than the third threshold T3. For example, formula 1 provides a range for the via count.

$$T2 < \text{via count} < T3 \quad (1)$$

where second threshold T2 is a lower limit of the via count, via count is the via count of one or more metal portions and third threshold T3 is an upper limit of the via count.

In some embodiments, the second or third threshold T2, T3 is specified by the relevant information in operation 104 of method 100. In some embodiments, in generating the condensed layout, operation 106a of method 100' does not remove item 212 from the layout. In some embodiments, one or more metal portions with a via count less than a second threshold T2, or a via count greater than a third threshold T3 are not related to ESD (e.g., method 100) and therefore are removed in operation 106a from the layout in generating the condensed layout. In some embodiments, one or more metal portions with a via count greater than a second threshold T2, and a via count less than a third threshold T3 are related to ESD (e.g., method 100) and therefore are not removed in operation 106a from the layout in generating the condensed layout.

Item 214 comprises one or more metal portions with a via count greater than a fourth threshold, wherein the via count is specified per a unit area. In some embodiments, the fourth threshold is specified by the relevant information in operation 104 of method 100. In some embodiments, in generating the condensed layout, operation 106a of method 100' does not remove item 214 from the layout. In some embodiments, one or more metal portions with a via count less than a fourth threshold are not related to ESD (e.g., method 100) and therefore are removed in operation 106a from the layout in generating the condensed layout. In some embodiments, one or more metal portions with a via count greater than a fourth threshold are related to ESD (e.g., method 100) and therefore are not removed in operation 106a from the layout in generating the condensed layout.

Figure 2B:
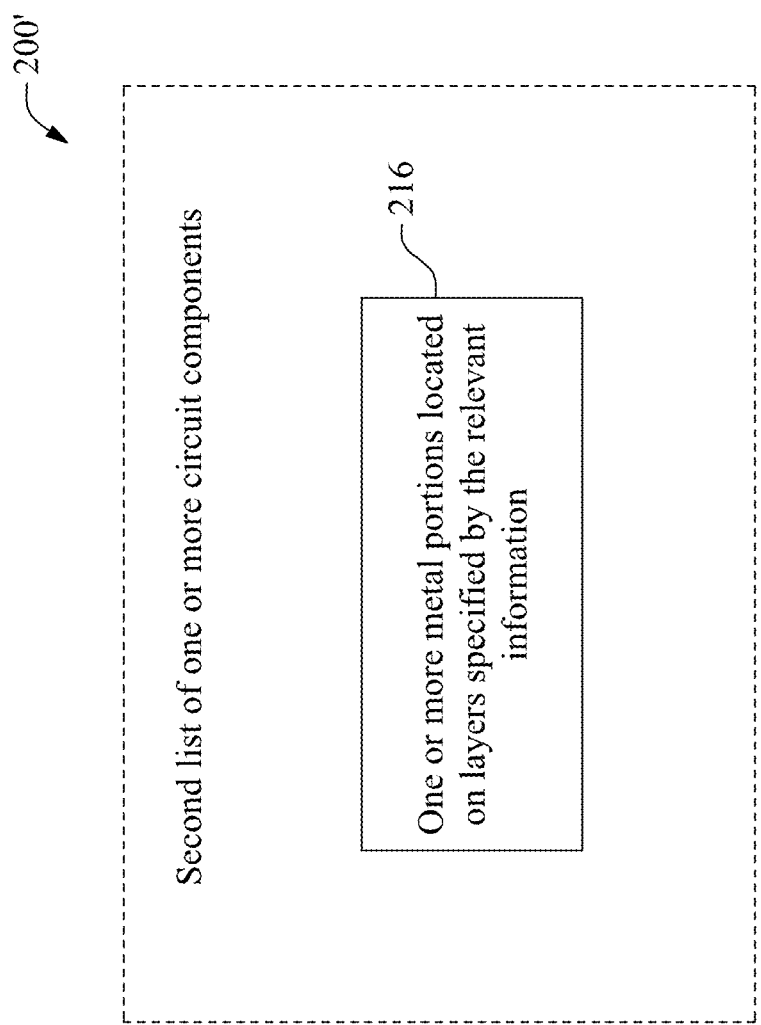
FIG. 2B is a schematic diagram of a second list of one or more circuit components not removed in operation 106a in generating a condensed layout of an integrated circuit in accordance with some embodiments.

FIG. 2B is a schematic diagram of a second list 200' of one or more circuit components not removed in operation 106 in generating a condensed layout of an integrated circuit in accordance with some embodiments.

Second list 200' is a list of items or circuit components of the plurality of circuit components in the layout checked by operation 106b in method 100'. In some embodiments, the items identified in second list 200' are not related to ESD of an integrated circuit as performed by method 100. In some embodiments, the items identified in second list 200' are removed from the layout during operation 106b. In some embodiments, the items in the layout that are not identified in second list 200' are not removed from the layout during operation 106b. In some embodiments, each of the items in second list 200' is checked by operation 106b and the condensed layout does not contain circuit components that are included in second list 200'. In some embodiments, second list 200' is received as relevant information in operation 104. In some embodiments, second list 200' is stored on a non-transitory computer readable medium.

Second list 200' comprises an item 216. Item 216 comprises one or more metal portions located on layers specified by the relevant information. In some embodiments, in generating the condensed layout, operation 106b of method 100' removes item 216 from the condensed layout. In some embodiments, in generating the condensed layout, operation 106b of method 100' removes one or more metal portions specified by the corresponding layer number from the condensed layout.

In some embodiments, the user interface (e.g., user interface 700) is configured to remove layers of the condensed layout (e.g., item 216) even though the removed layers were not removed by operation 106a since they were contained in first list 200 (e.g., item 202, item 204, item 206, item 208, item 210 or item 212). In some embodiments, item 216 allows the circuit designer to remove layers from the condensed layout, even though the removed layers are contained in first list 200 (e.g., item 202, item 204, item 206, item 208, item 210 or item 212). In some embodiments, item 216 is utilized to remove from the condensed layout items contained in the second list 200' that are also contained in the first list 200.

Figure 3:
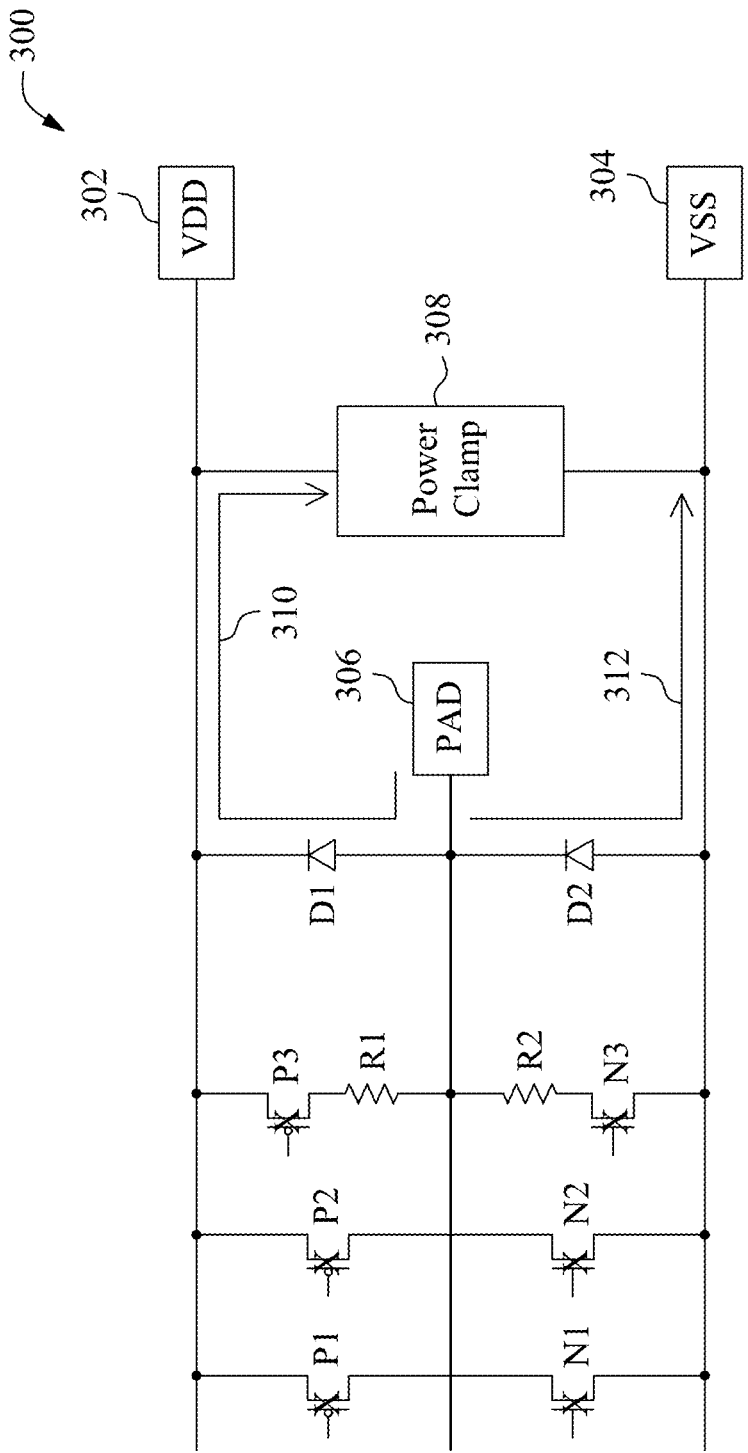
FIG. 3 is a schematic diagram of an integrated circuit, e.g., integrated circuit 300, after execution of operation 106a shown in FIG. 1B when the first list includes an (electrostatic discharge) ESD circuit, e.g., ESD circuit 202, and an ESD current path, ESD current path 204, in accordance with some embodiments.

FIG. 3 is a schematic diagram of an integrated circuit, e.g., integrated circuit 300, after execution of operation 106a shown in FIG. 1 when the first list includes an ESD circuit, e.g., item 202, and an ESD current path, e.g., item 204, in accordance with some embodiments.

After operation 106a, as shown in FIG. 3, integrated circuit 300 comprises a diode D1, a diode D2, a resistor R1, a resistor R2, a voltage source 302, a ground reference voltage 304, a pad 306 and a power clamp 308. In some embodiments, diode D1 is an ESD circuit. In some embodiments, diode D2 is an ESD circuit. In some embodiments, power clamp 308 is an ESD circuit. A first ESD current path 310 is between pad 306 and power clamp 308. A second ESD current path 312 is between pad 306 and ground reference voltage 304. In some embodiments, resistor R1 or R2 is removed from integrated circuit 300 during execution of operation 106a. In some embodiments, resistor R1 or R2 is not removed from integrated circuit 300 during execution of operation 106a.

For example, in some embodiments, the ESD circuits (e.g., diode D1, diode D2 or power clamp 308) are a part of the first list (e.g., item 202) in method 100' and are not removed from integrated circuit 300 during operation 106a. For example, in some embodiments, the ESD circuits (e.g., voltage source 302, ground reference voltage 304 or pad 306) are a part of the first list (e.g., item 202 or item 204) in method 100' and are not removed from integrated circuit 300 during operation 106a. For example, in some embodiments, the ESD current paths (e.g., first current path 310 or second current path 312) are a part of the first list (e.g., item 204) in method 100' and are not removed from integrated circuit 300 during operation 106a.

Prior to operation 106a of method 100, integrated circuit 300 also included PMOS transistors P1, P2 and P3, NMOS transistors N1, N2 and N3. For example, in some embodiments, PMOS transistors P1, P2 and P3, NMOS transistors N1, N2 and N3 are not part of the first list in method 100', and are removed from integrated circuit 300 during operation 106a.

Although FIG. 3 illustrates two ESD current paths (e.g., first ESD current path 310 and second ESD current path 312), alternative embodiments include a single ESD current path consistent with the teachings disclosed herein. Although FIG. 3 illustrates two ESD current paths (e.g., first ESD current path 310 and second ESD current path 312), alternative embodiments include more than two ESD current paths consistent with the teachings disclosed herein.

Figure 4:
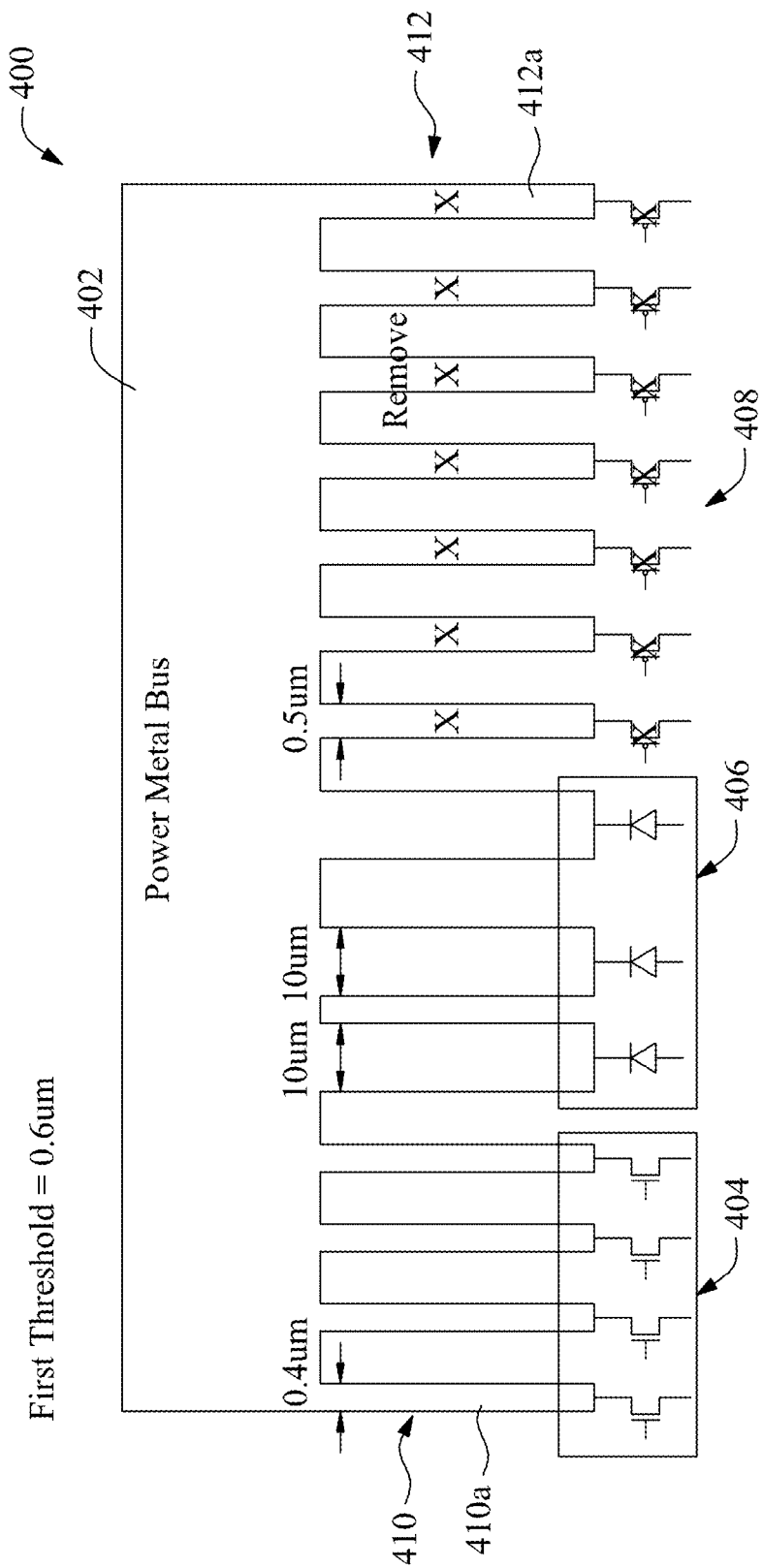
FIG. 4 is a layout diagram, e.g., layout diagram 400, of an integrated circuit after execution of operation 106a shown in FIG. 1A when the first list includes an ESD circuit, e.g., item 202, an ESD current path, item 204, and one or metal portions with a width greater than a first threshold, e.g., item 210, in accordance with some embodiments.

FIG. 4 is a layout diagram, e.g., layout diagram 400, of an integrated circuit after execution of operation 106a shown in FIG. 1 when the first list includes an ESD circuit, e.g., item 202, an ESD current path, e.g., item 204, and one or metal portions with a width greater than a first threshold, e.g., item 210, in accordance with some embodiments.

After operation 106a, as shown in FIG. 4, layout diagram 400 comprises a power metal bus 402, a plurality of NMOS transistors 404, a plurality of diodes 406 and a plurality of connectors 410.

In some embodiments, plurality of NMOS transistors 404 is an ESD circuit (e.g., as identified in FIG. 2 as item 202). In some embodiments, plurality of diodes 406 is an ESD circuit (e.g., as identified in FIG. 2 as item 202). In some embodiments, power metal bus 402 are one or more metal portions (e.g., as identified in FIG. 2 as item 208) directly connected to the ESD circuit (e.g., plurality of NMOS transistors 404 or plurality of diodes 406). In some embodiments, plurality of connectors 410 are one or more metal portions (e.g., as identified in FIG. 2 as item 208) directly connected to the ESD circuit (e.g., plurality of NMOS transistors 404 or plurality of diodes 406).

For example, in some embodiments, the ESD circuits (e.g., plurality of NMOS transistors 404 or plurality of diodes 406) are a part of the first list (e.g., as item 202) in method 100', and are not removed from layout diagram 400 during operation 106a. For example, in some embodiments, the one or more metal portions (e.g., power metal bus 402 or plurality of connectors 410) directly connected to the ESD circuit (e.g., plurality of NMOS transistors 404 or plurality of diodes 406) are a part of the first list (e.g., as item 208) in method 100' and are not removed from layout diagram 400 during operation 106a.

Plurality of connectors 410 includes connector 410a. Connector 410a has a width of 0.4 micrometers (μm). In some embodiments, operation 106a is configured to remove one or more metal portions having a width less than a first threshold (e.g., one or more metal portions that do not meet the requirements of item 210). For example, in some embodiments, the first threshold is 0.6 μm, so operation 106a of method 100 would attempt to remove connector 410a, however, since connector 410a is directly connected to an ESD circuit, connector 410a is a part of the first list (e.g., as item 208) in method 100', and is therefore not removed from layout diagram 400 during operation 106a.

Prior to operation 106a of method 100, layout diagram 400 also included PMOS transistors 408 and plurality of connectors 412. For example, in some embodiments, PMOS transistors 408 and plurality of connectors 412 are not part of the first list in method 100' and are removed from layout diagram 400 during operation 106a.

Figure 5A:
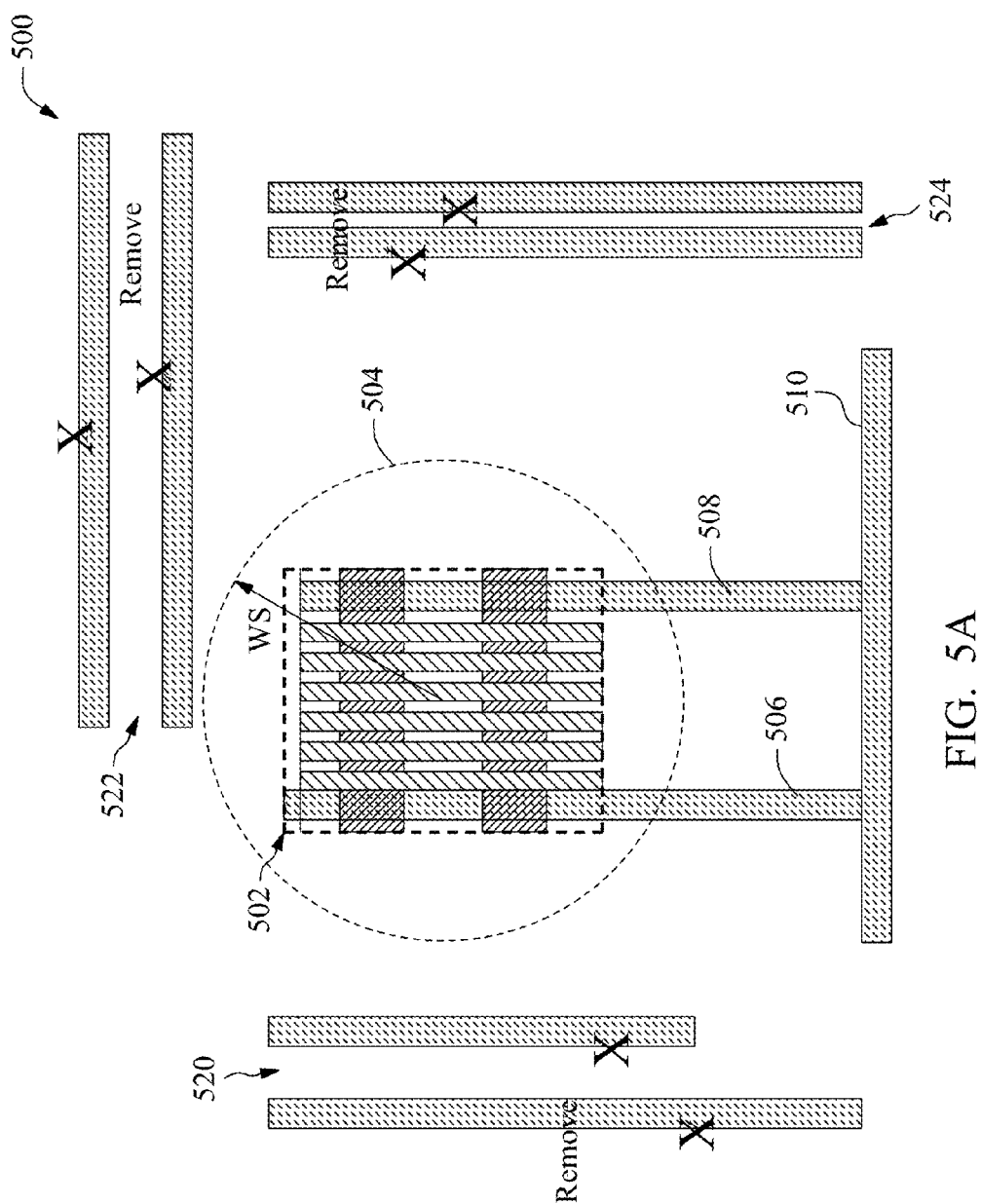
FIG. 5A is a layout diagram, e.g., layout diagram 500, of an integrated circuit after execution of operation 106a shown in FIG. 1B when the first list includes an ESD circuit, e.g., item 202, an ESD current path, item 204, and one or metal portions directly connected to the ESD circuit and adjacent to the ESD circuit, e.g., item 208, in accordance with some embodiments.

FIG. 5A is a layout diagram, e.g., layout diagram 500, of an integrated circuit after execution of operation 106a shown in FIG. 1 when the first list includes an ESD circuit, e.g., item 202, an ESD current path, item 204, and one or metal portions directly connected to the ESD circuit or adjacent to the ESD circuit, e.g., item 208, in accordance with some embodiments.

After operation 106a, as shown in FIG. 5A, layout diagram 500 comprises a region 502 and one or more metal portions 506, 508 and 510. In some embodiments, region 502 is an ESD circuit, an ESD path or one or more metal portions directly connected to an ESD circuit or adjacent to an ESD circuit as identified in first list 200 of FIG. 2A.

In some embodiments, one or more metal portions 506, 508 or 510 (e.g., as identified in FIG. 2 as item 208) are directly connected to the ESD circuit (e.g., region 502). In some embodiments, one or more metal portions 506, 508 or 510 (e.g., as identified in FIG. 2 as item 208) are adjacent to the ESD circuit (e.g., region 502). An adjacent metal portion is a metal portion within a predetermined distance of one or more ESD circuits in the layout. For example, in some embodiments, the predetermined distance (e.g., radius) is 100 μm and is illustrated as a circle 504. In some embodiments, the predetermined distance ranges from about 50 μm to about 100 μm. In some embodiments, the predetermined distance is implemented as a polygon. In some embodiments, region 502 is bounded within the circle 504 and is therefore adjacent to the ESD circuit. In some embodiments, one or more metal portions 506, 508 or 510 are directly connected to the ESD circuit (e.g., region 502) even though they are not bounded within the circle 504 and are not adjacent to the ESD circuit (e.g., region 502).

For example, in some embodiments, the ESD circuits (e.g., region 502) are a part of the first list (e.g., as item 202) in method 100', and are not removed from layout diagram 500 during operation 106a. For example, in some embodiments, the one or more metal portions (e.g., one or more metal portions 506, 508 or 510) directly connected to the ESD circuit (e.g., region 502) are a part of the first list (e.g., as item 208) in method 100', and are not removed from layout diagram 500 during operation 106a.

Prior to operation 106a of method 100, layout diagram 500 also included one or more metal portions 520, 522 and 524. For example, in some embodiments, one or more metal portions 520, 522 and 524 are not part of the first list in method 100' since they are not directly connected to the ESD device (e.g., region 502) and are not adjacent to the ESD device (e.g., region 502), and are removed from layout diagram 400 during operation 106a.

Figure 5B:
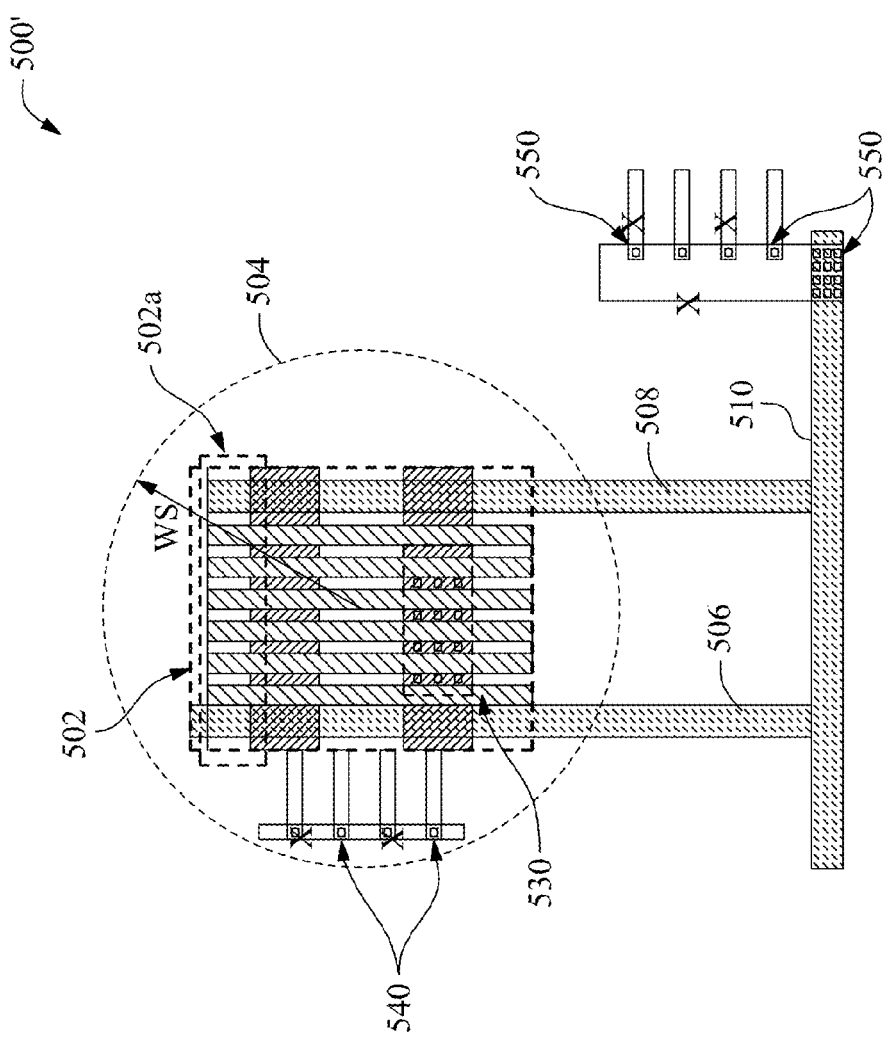
FIG. 5B is a layout diagram, e.g., layout diagram 500', of an integrated circuit after execution of operation 106a shown in FIG. 1B when the first list includes an ESD circuit, e.g., item 202, an ESD current path, item 204, one or metal portions directly connected to the ESD circuit and adjacent to the ESD circuit, e.g., item 208, and one or metal portions with a via count greater than a second threshold, and less than a third threshold, e.g., item 212, in accordance with some embodiments.

FIG. 5B is a layout diagram, e.g., layout diagram 500', of an integrated circuit after execution of operation 106a shown in FIG. 1 when the list includes an ESD circuit, e.g., item 202, an ESD current path, item 204, one or metal portions directly connected to the ESD circuit or adjacent to the ESD circuit, e.g., item 208, one or metal portions having a via count greater than a second threshold T2, and less than a third threshold T3, e.g., item 212, one or metal portions having a via count greater than a fourth threshold, e.g., item 214, in accordance with some embodiments. Layout diagram 500' is an embodiment of layout diagram 500 of FIG. 5A with similar elements. In comparison with FIG. 5A, layout diagram 500' also includes a via region 530 and a plurality of vias 540. Region 502 includes a first region 502a. First region 502a is a portion of region 102.

After operation 106a, as shown in FIG. 5A, layout diagram 500 comprises via region 530, and plurality of vias 540.

In some embodiments, via region 530 includes one or more metal portions having a via count (e.g., as identified in FIG. 2 as item 212) greater than a second threshold and less than a third threshold are a part of the first list (e.g., as item 200) in method 100' and are not removed from layout diagram 500' during operation 106a. In some embodiments, via region 530 includes one or more metal portions having a via count (e.g., as identified in FIG. 2 as item 214) greater than a fourth threshold (per unit area) are a part of the first list (e.g., as item 200) in method 100' and are not removed from layout diagram 500' during operation 106a.

In some embodiments, plurality of vias 542 includes one or more metal portions with a via count (e.g., as identified in FIG. 2 as item 212) less than a second threshold T2 and greater than a third threshold T3 are not a part of the first list (e.g., as item 200) in method 100', and are removed from layout diagram 500' during operation 106a. In some embodiments, plurality of vias 542 includes one or more metal portions with a via count (e.g., as identified in FIG. 2 as item 214) less than a fourth threshold (per unit area) are not a part of the first list (e.g., as item 200) in method 100', and are removed from layout diagram 500' during operation 106a.

Prior to operation 106a of method 100, layout diagram 500' also included vias 550. For example, in some embodiments, vias 550 includes one or more metal portions with a via count less than a second threshold T2 and greater than a third threshold, are not a part of the first list (e.g., as item 200) in method 100', and are removed from layout diagram 500' during operation 106a. For example, in some embodiments, vias 550 includes one or more metal portions with a via count less than a fourth threshold (per unit area), are not a part of the first list (e.g., as item 200) in method 100', and are removed from layout diagram 500' during operation 106a.

Figure 6:
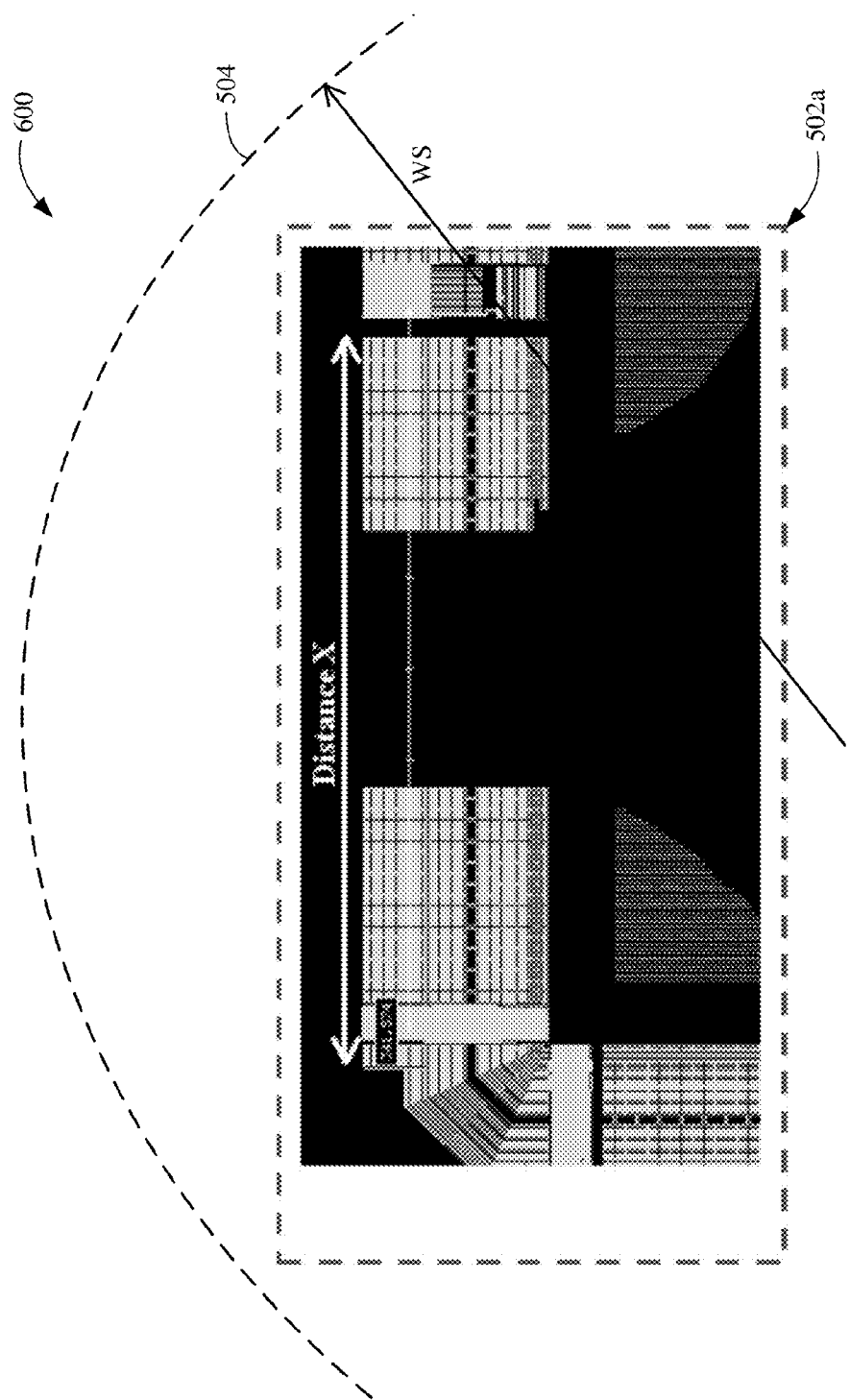
FIG. 6 is a layout diagram of a portion of an integrated circuit in accordance with some embodiments.

FIG. 6 is a layout diagram, e.g., layout diagram 600, of a portion of an integrated circuit in accordance with some embodiments. Layout diagram 600 is an embodiment of layout diagram 500' of FIG. 5B with similar elements. Layout diagram 600 comprises first region 502a and circle 504 of FIGS. 5A-5B.

Circle 504 has a radius WS. Radius WS is the predetermined distance of one or more ESD circuits in the layout. In some embodiments, the predetermined distance is a window size that is utilized to define the ESD circuit (e.g., region 502a). In some embodiments, the predetermined distance of radius WS ranges from about 50 µm to about 100 µm. In some embodiments, the predetermined distance is based on the size of the input output-ring (IO) metal routing such that the window defined by the predetermined distance encloses the IO-ring metal routing portions. In some embodiments, the radius WS of the predetermined distance is one half of the maximum OD to OD distance of the IO-ring metal routing. For example, in some embodiments, the maximum OD to OD distance of the IO-ring metal routing is X, so the predetermined distance of radius WS is X/2.

Figure 7:
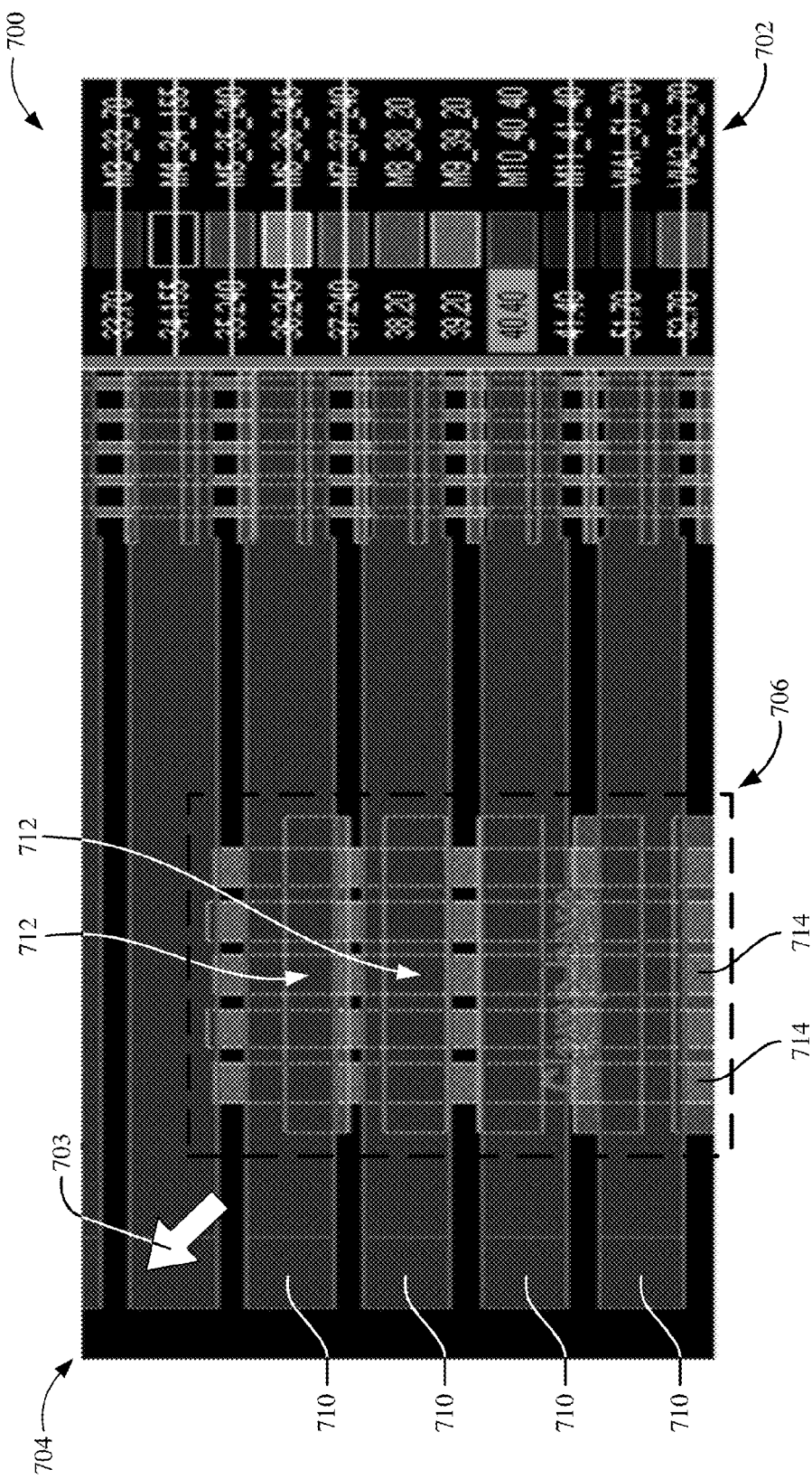
FIG. 7 is a schematic view of portion of a user interface of an integrated circuit in accordance with some embodiments.

FIG. 7 is a schematic view of a portion of a user interface 700 of the integrated circuit in FIG. 3 in accordance with some embodiments. In some embodiments, user interface 700 is a user interface displayed by method 100. In some embodiments, user interface 700 is configured to receive data from a user. In some embodiments, user interface 700 is configured to display the condensed layout of the integrated circuit. User interface 700 comprises a layer field 702, a cursor 703 and a condensed layout field 704.

Layer field 702 is an area of the user interface 700, where a user selects relevant information of the integrated circuit. In some embodiments, the relevant information of FIG. 7 comprises the relevant information previously described in method 100 of FIG. 1A, method 100' of FIG. 1B, and items contained in first list 200 of FIG. 2A. In some embodiments, the layer field 702 is a data field which includes one or more layers contained in the integrated circuit. In some embodiments, the layer field 702 includes one or more metal layers contained in the integrated circuit. In some embodiments, the layer field 702 includes one or more vias contained in the integrated circuit. In some embodiments, the layer field 702 includes one or more ESD circuit components contained in the integrated circuit. In some embodiments, the layer field 702 includes the different components contained in an individual layer of the integrated circuit. In some embodiments, the layer field 702 displays some or all of the components contained in a particular layer of the integrated circuit.

In some embodiments, layer field 702 is configured to be selected by a user (e.g., by cursor 703) to select one or more entries (e.g., M3, M4, M5, M6, M7, M8, M9, M10, M11, VIA1 or VIA2) in the layer field 702. In some embodiments, if one or more entries (e.g., M3, M4, M5, M6, M7, M8, M9, M10, M11, VIA1 or VIA2) in the layer field 702 are selected, then the one or more selected entries (e.g., M3, M4, M5, M6, M7, M8, M9, M10, M11, VIA1 or VIA2) in layer field 702 are displayed with a line through them. In some embodiments, if one or more entries (e.g., M3, M4, M5, M6, M7, M8, M9, M10, M11, VIA1 or VIA2) in the layer field 702 are selected, then the one or more selected entries (e.g., M3, M4, M5, M6, M7, M8, M9, M10, M11, VIA1 or VIA2) in layer field 702, and the corresponding layers associated with the selected entries (e.g., M3, M4, M5, M6, M7, M8, M9, M10, M11, VIA1 or VIA2) are removed from the condensed layout of the integrated circuit and are no longer displayed in condensed layout field 704. For example, as shown in FIG. 7, entries M3, M4, M5, M6 M7, M11, VIA1 and VIA2 are selected by cursor 703, and are displayed in layer field 702 with a line through each of them, and corresponding layers associated with each of entries M3, M4, M5, M6 M7, M11, VIA1 and VIA2 are not displayed in condensed layout field 704 since they were removed from the condensed layout of the integrated circuit.

For example, as shown in FIG. 7, entries M8, M9 and M10 are not selected by cursor 703, and are displayed in layer field 702 without a line through each of them, and corresponding layers associated with each of entries M8, M9 and M10 (e.g., plurality of first metal lines 710, a plurality of second metal lines 712 and a plurality of third metal lines 714) are displayed in condensed layout field 704 since they were not removed from the condensed layout of the integrated circuit.

Cursor 703 is a cursor configured to select relevant information displayed on the user interface 700.

Condensed layout field 704 is an area of the user interface 700 which displays one or more of the layers contained in the condensed layout of the integrated circuit. In some embodiments, condensed layout field 704 is classified by the relevant information previously described in FIGS. 1A-1B and items contained in first list 200 of FIG. 2 and second list 200' of FIG. 2B.

In some embodiments, condensed layout field 704 is configured to be selected by a user (e.g., by cursor 703) to select one or more layers (e.g., plurality of first metal lines 710, a plurality of second metal lines 712 and a plurality of third metal lines 714) of the condensed layout. In some embodiments, if the one or more layers of the condensed layout are selected, then the corresponding entry (e.g., M3, M4, M5, M6, M7, M8, M9, M10, M11, VIA1 or VIA2) in layer field 702 associated with the selected one or more layers is highlighted in layer field 702. In some embodiments, the user interface 700 is configured such that by selecting one or more layers (e.g., plurality of first metal lines 710, a plurality of second metal lines 712 and a plurality of third metal lines 714) of condensed layout field 704, the selected one or more layer is removed from the condensed layout.

Condensed layout field 704 comprises a clamp circuit 706, a plurality of first metal lines 710, a plurality of second metal lines 712 and a plurality of third metal lines 714.

Clamp circuit 706 comprises a plurality of first metal lines 710, a plurality of second metal lines 712 and a plurality of third metal lines 714.

In some embodiments, user interface 700 is configured to allow the user to remove layers of the condensed layout defined in second list 200' even though the removed layers were not removed by operation 106a in method 100. In some embodiments, user interface 700 is configured to allow the circuit designer the freedom to remove layers from the condensed layout, defined in second list 200', even though the removed layers were not removed by operation 106a of method 100' since the removed layers were identified in first list 200.

For example, method 100 determined that the region defined by clamp circuit 706 was adjacent to the ESD circuit, and method 100 did not remove layers (which are not related to ESD circuit) below clamp circuit 706 or above clamp circuit 706 from the condensed layout. In this example, user interface 700 is configured to allow the user to remove layers M1, M2, M3, M4, M5, M6, M7, VIA1 and VIA2 from the condensed layout since the removed layers are not related to the ESD circuit. For example, as shown in FIG. 7, layers located below the clamp (M1-M7) are removed since in this integrated circuit design these layers are not utilized for ESD, even though they are located adjacent to the ESD circuit. For example, as shown in FIG. 7, layers located above the clamp (M11 and VIA1 and VIA2) are removed since in this integrated circuit design these layers are not utilized for ESD, even though they are located adjacent to the ESD circuit.

Figure 8A:
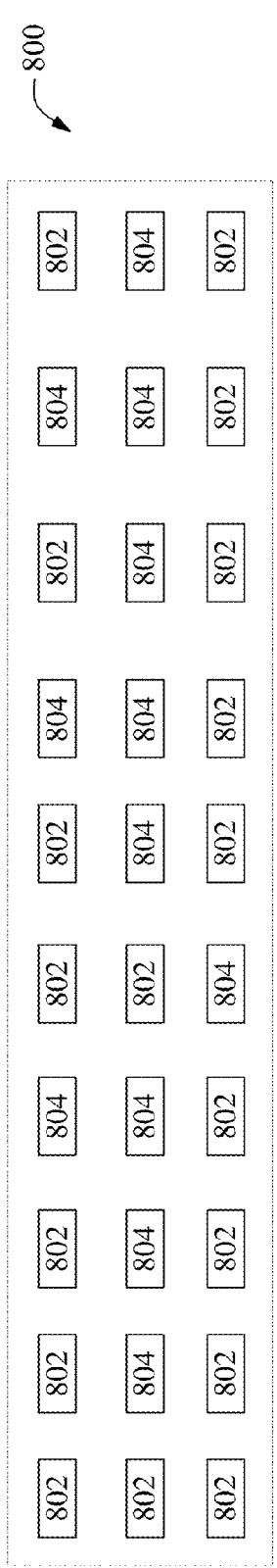
FIG. 8A is a layout diagram of an integrated circuit before execution of method 100 shown in FIG. 1A in accordance with some embodiments.

FIG. 8A is a layout diagram, e.g., layout diagram 800, of an integrated circuit before execution of method 100 shown in FIG. 1 in accordance with some embodiments. Layout diagram 800 is an embodiment of layout diagram 400 shown in FIG. 4. Layout diagram 800 is an embodiment of layout diagram 500 shown in FIG. 5A. Layout diagram 800 is an embodiment of layout diagram 500' shown in FIG. 5B. Layout diagram 800 is an embodiment of layout diagram 600 shown in FIG. 6. Layout diagram 800 is an embodiment of layout diagram 700 shown in FIG. 7.

Layout diagram 800 includes a plurality of first circuit components 802 and a plurality of second circuit components 804. First circuit components 802 are an embodiment of the circuit components in an integrated circuit identified in list 200. Second circuit components 804 are an embodiment of the circuit components in an integrated circuit not identified in list 200.

Figure 8B:
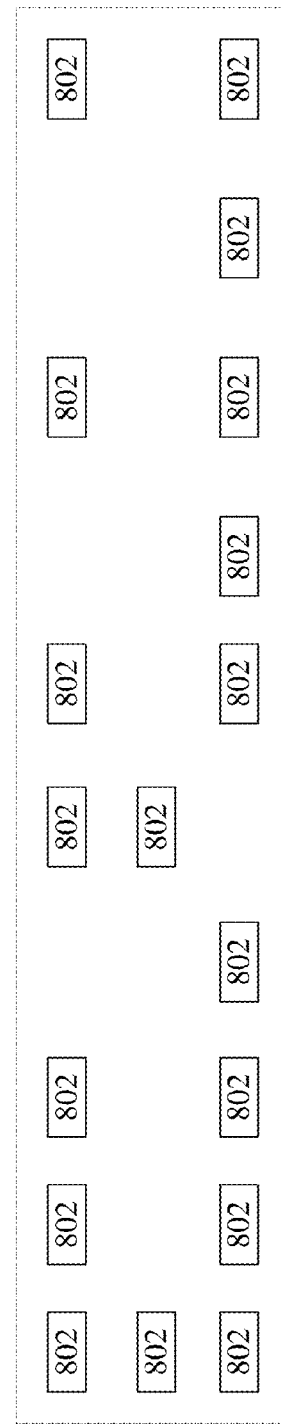
FIG. 8B is the layout diagram of the integrated circuit in FIG. 8A after execution of method 100 shown in FIG. 1A in accordance with some embodiments.

FIG. 8B is a layout diagram, e.g., layout diagram 800', of the integrated circuit in FIG. 8A after execution of method 100 shown in FIG. 1A in accordance with some embodiments. Layout diagram 800' is an embodiment of layout diagram 400 shown in FIG. 4. Layout diagram 800' is an embodiment of layout diagram 500 shown in FIG. 5A. Layout diagram 800' is an embodiment of layout diagram 500' shown in FIG. 5B. Layout diagram 800' is an embodiment of layout diagram 600 shown in FIG. 6. Layout diagram 800' is an embodiment of layout diagram 700 shown in FIG. 7.

In comparison with FIG. 8A, layout diagram 800' of FIG. 8B does not include the plurality of second circuit components 804. As shown in FIG. 8B, layout diagram 800' includes less circuit components than layout diagram 800. In some embodiments, layout diagram 800' does not include circuit components not identified in list 200. In some embodiments, layout diagram 800' only includes circuit components identified in list 200.

In some embodiments, the amount of time to perform an ESD check of layout diagram 800' is less than the amount of time to perform an ESD check of layout diagram 800. In some embodiments, the amount of time to perform an ESD check of layout diagram 800' is up to 8.5 times less than the amount of time to perform an ESD check of layout diagram 800. In some embodiments, the amount of memory to perform an ESD check of layout diagram 800' is less than the amount of memory to perform an ESD check of layout diagram 800. In some embodiments, the amount of memory to perform an ESD check of layout diagram 800' is up to 8.5 times less than the amount of memory to perform an ESD check of layout diagram 800.

In some embodiments, the amount of time to perform a layout versus schematic (LVS) operation of layout diagram 800' is less than the amount of time to perform an LVS operation of layout diagram 800. In some embodiments, the amount of time to perform an LVS operation of layout diagram 800' is up to seven times less than the amount of time to perform an LVS operation of layout diagram 800.

In some embodiments, the amount of time to perform a resistance capacitance (RC) extraction of layout diagram 800' is less than the amount of time to perform an RC extraction of layout diagram 800. In some embodiments, the amount of time to perform an RC extraction of layout diagram 800' is up to eight times less than the amount of time to perform an RC extraction of layout diagram 800.

Figure 9:
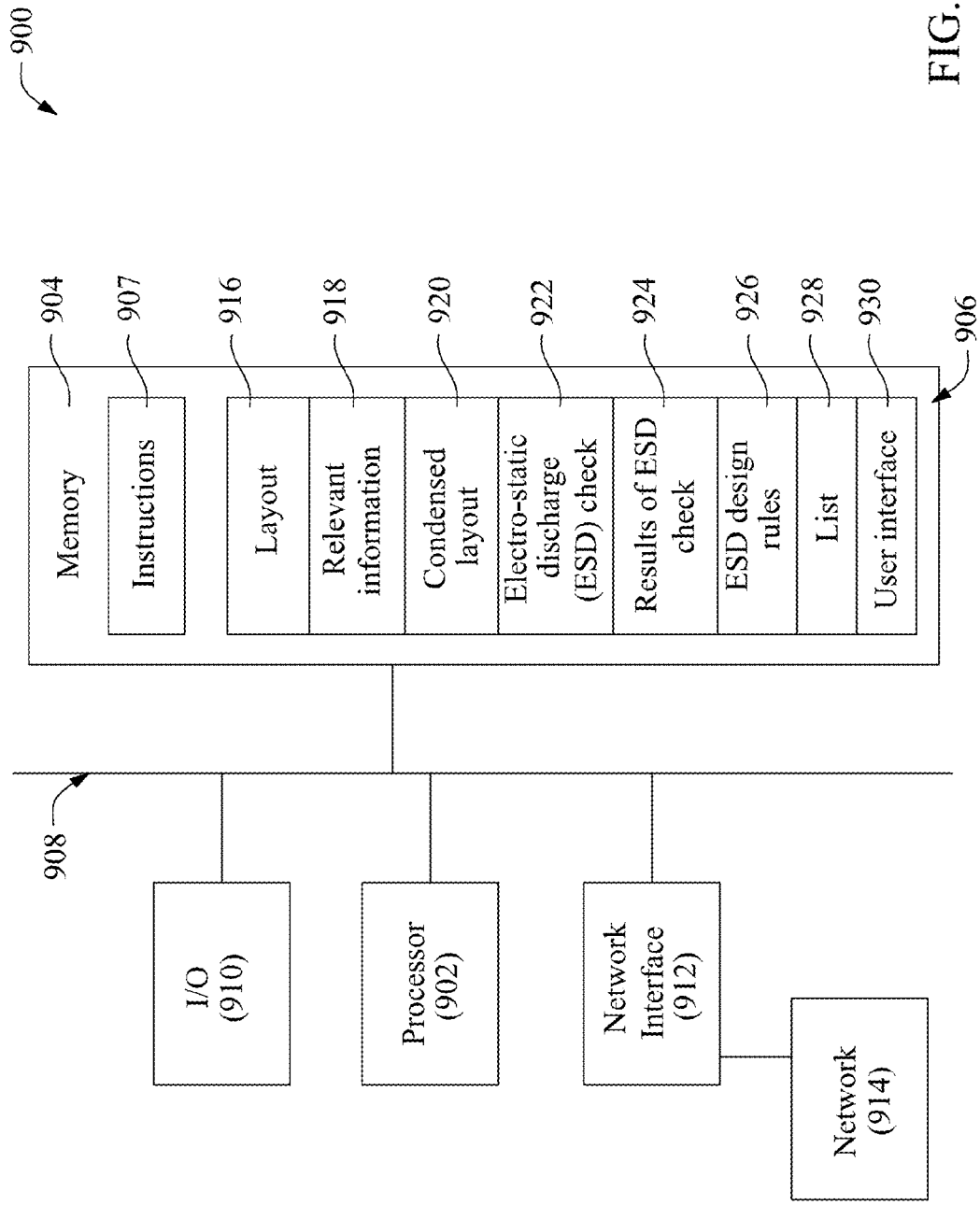
FIG. 9 is a block diagram of a control system for performing an electrostatic discharge check of an integrated circuit in accordance with one or more embodiments.

FIG. 9 is a block diagram of a control system 900 for designing an integrated circuit in accordance with one or more embodiments.

In some embodiments, the control system 900 is a general purpose computing device which implements method 100 of FIG. 1 with list 200 of FIG. 2 in accordance with one or more embodiments. Control system 900 includes a hardware processor 902 and a non-transitory, computer readable storage medium 904 encoded with, i.e., storing, the computer program code 906, i.e., a set of executable instructions. Computer readable storage medium 904 is also encoded with instructions 907 for interfacing with manufacturing machines for producing the semiconductor device. The processor 902 is electrically coupled to the computer readable storage medium 904 via a bus 908. The processor 902 is also electrically coupled to an I/O interface 910 by bus 908. A network interface 912 is also electrically connected to the processor 902 via bus 908. Network interface 912 is connected to a network 914, so that processor 902 and computer readable storage medium 904 are capable of connecting to external elements via network 914. The processor 902 is configured to execute the computer program code 906 encoded in the computer readable storage medium 904 in order to cause system 900 to be usable for performing a portion or all of the operations as described e.g., in method 100.

In one or more embodiments, the processor 902 is a central processing unit (CPU), a multi-processor, a distributed processing system, an application specific integrated circuit (ASIC), and/or a suitable processing unit.

In one or more embodiments, the computer readable storage medium 904 is an electronic, magnetic, optical, electromagnetic, infrared, and/or a semiconductor system (or apparatus or device). For example, the computer readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium 904 includes a compact disk-read only memory (CD-ROM), a compact disk-read/write (CD-R/W), and/or a digital video disc (DVD).

In one or more embodiments, the storage medium 904 stores the computer program code 906 configured to cause system 900 to perform method 100. In one or more embodiments, the storage medium 904 also stores information needed for performing method 100 as well as information generated during execution of method 100, such as layout 916, relevant information 918, condensed layout 920, ESD check 922, results of ESD check 924, ESD design rules 926, list 928, user interface (UI) 930, and/or a set of executable instructions to perform the operation of method 100. In some embodiments, UI 930 is a graphical user interface (GUI).

In one or more embodiments, the storage medium 904 stores instructions 907 for interfacing with external machines. The instructions 907 enable processor 902 to generate instructions readable by the external machines to effectively implement method 100 during an integrated circuit design process. In some embodiments, the integrated circuit including one or more circuit elements. The instructions 907 enable processor 902 to generate instructions readable by the external machines to effectively implement method 100 during an integrated circuit design.

Control system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

Control system 900 also includes network interface 912 coupled to the processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1394. In one or more embodiments, method 100 is implemented in two or more systems 900, and information such as layout 916, relevant information 918, condensed layout 920, ESD check 922, results of ESD check 924, ESD design rules 926, list 928, UI 930 are exchanged between different systems 900 via network 914.

System 900 is configured to receive information related to a layout through I/O interface 910. The information is transferred to processor 902 via bus 908 to generate layout. The layout is then stored in computer readable medium 904 as Layout 916. Control system 900 is configured to receive information related to relevant information through I/O interface 910. The information is stored in computer readable medium 904 as relevant information 918. Control system 900 is configured to receive information related to a condensed layout through I/O interface 910. The information is stored in computer readable medium 904 as condensed layout 920. Control system 900 is configured to receive information related to an ESD check through I/O interface 910. The information is stored in computer readable medium 904 as ESD check 922. Control system 900 is configured to receive information related to results of ESD check through I/O interface 910. The information is stored in computer readable medium 904 as Results of ESD check 924. Control system 900 is configured to receive information related to ESD design rules through I/O interface 910. The information is stored in computer readable medium 904 as ESD design rules 926. Control system 900 is configured to receive information related to a list through I/O interface 910. The information is stored in computer readable medium 904 as List 928. Control system 900 is configured to receive information related to a user interface through I/O interface 910. The information is stored in computer readable medium 904 as User Interface 930.

In some embodiments, method 100 is implemented as a standalone software application for execution by a processor. In some embodiments, method 100 is implemented as a software application that is a part of an additional software application. In some embodiments, method 100 is implemented as a plug-in to a software application. In some embodiments, method 100 is implemented as a software application that is a portion of an EDA tool. In some embodiments, method 100 is implemented as a software application that is used by an EDA tool. In some embodiments, the EDA tool is used to generate a layout or a condensed layout of the semiconductor device. In some embodiments, the layout or the condensed layout is stored on a non-transitory computer readable medium. In some embodiments, the layout or the condensed layout is generated using a tool such as VIRTUOSO® available from CADENCE DESIGN SYSTEMS, Inc., or another suitable layout generating tool. In some embodiments, the layout or the condensed layout is generated based on a netlist which is created based on the schematic design.

One of ordinary skill in the art would recognize that operations are able to be removed or that additional operations are able to be added to method 100 without departing from the scope of this description. One of ordinary skill in the art would also recognize that an order of operations in method 100 is able to be adjusted without departing from the scope of this description.

One aspect of this description relates to a method of designing an integrated circuit. The method includes generating, by a processor, a layout of the integrated circuit, receiving a relevant information, generating a condensed layout of the integrated circuit from the layout, performing an ESD check of the condensed layout, and displaying a result of the ESD check. The relevant information includes a first list of one or more circuit components of the plurality of circuit components in the layout. The integrated circuit includes a plurality of circuit components. The first list includes an ESD circuit and an associated ESD current path. The condensed layout includes a portion of the layout identified in the first list. The ESD check is configured to verify compliance with one or more ESD design rules.

Another aspect of this description relates to a system for designing an integrated circuit. The system includes at least one processor and at least one memory including computer program code for one or more programs, the at least one memory and the computer program code being configured to, with the at least one processor, cause the system to generate a layout of the integrated circuit, wherein the integrated circuit comprises a plurality of circuit components, receive a relevant information, wherein the relevant information comprises a first list of one or more circuit components of the plurality of circuit components in the layout, wherein the first list comprises an ESD circuit, an associated ESD current path; and a layer number on which the ESD circuit is located; generate a condensed layout of the integrated circuit from the layout, wherein the condensed layout comprises a portion of the layout identified in the first list; perform an ESD check of the condensed layout, wherein the ESD check is configured to verify compliance with one or more ESD design rules; and display a result of the ESD check.

Still another aspect of this description relates to a computer readable medium including at least computer executable instructions for carrying out a method for designing an integrated circuit. The method includes generating a layout of the integrated circuit, receiving a relevant information, generating a condensed layout of the integrated circuit from the layout, performing an ESD check of the condensed layout and displaying a result of the ESD check. The integrated circuit comprises a plurality of circuit components. The relevant information comprises a first list of one or more circuit components of the plurality of circuit components in the layout, wherein the first list comprises an ESD circuit, an associated ESD current path and one or more first metal portions directly connected to the ESD circuit or adjacent to the ESD circuit. The condensed layout comprises a portion of the layout identified in the first list. The ESD check is performed to verify compliance with one or more ESD design rules.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing an integrated circuit, the method comprising:
   receiving a first list corresponding to at least one circuit component in a layout, wherein
      the at least one circuit component is at least one circuit component of a plurality of circuit components in the layout,
      the first list is a subset of the plurality of circuit components, and
      the at least one circuit component comprises:
         an electrostatic discharge (ESD) circuit, and
         an associated ESD current path;
   generating, by a processor, a condensed layout from the layout by reducing a number of circuit components of the plurality of circuit components, wherein the condensed layout comprises the at least one circuit component; and
   performing an ESD check of the condensed layout, wherein the ESD check is configured to verify compliance with one or more ESD design rules.

2. The method of claim 1, further comprising generating the layout.

3. The method of claim 1, wherein the reducing the number of circuit components of the plurality of circuit components comprises removing a circuit component in the layout not identified in the first list.

4. The method of claim 1, wherein the first list comprises a second list including one or more layers of circuit elements identified in the first list; and
   wherein the generating the condensed layout from the layout comprises removing circuit components identified in the second list.

5. The method of claim 1, wherein the first list comprises a layer number on which the ESD circuit is located.

6. The method of claim 1, wherein the first list comprises one or more metal portions directly connected to the ESD circuit.

7. The method of claim 1, wherein the first list comprises one or more metal portions adjacent to the ESD circuit.

8. The method of claim 1, wherein the first list comprises one or more metal portions having a width greater than a threshold.

9. The method of claim 1, wherein the first list comprises one or more metal portions having a via count greater than a first threshold, and the via count is less than a second threshold, wherein the first threshold is less than the second threshold.

10. A system for designing an integrated circuit, comprising:
    at least one processor; and
    at least one memory including computer program code for one or more programs, the at least one memory and the computer program code being configured to, with the at least one processor, cause the system to:
       receive a first list corresponding to at least one circuit component of a plurality of circuit components in a layout, wherein the at least one circuit component comprises:
          an electrostatic discharge (ESD) circuit;
          an associated ESD current path; and
          a layer number on which the ESD circuit is located;
       reduce a number of circuit components of the plurality of circuit components;
       generate a condensed layout from the reduced number of circuit components of the plurality of circuit components of the layout, wherein
          the first list is a subset of the plurality of circuit components, and
          the condensed layout comprises the at least one circuit component; and
       perform an ESD check of the condensed layout, wherein the ESD check is configured to verify compliance with one or more ESD design rules.

11. The system of claim 10, wherein the at least one memory and program code are configured to reduce the number of circuit components of the plurality of circuit components by removing a circuit component in the layout not identified in the first list.

12. The system of claim 10, wherein
    the first list comprises a second list including one or more layers of circuit elements identified in the first list; and the at least one memory and program code are configured to generate the condensed layout from the layout by removing one or more circuit components identified in the second list.

13. The system of claim 10, wherein the first list comprises one or more metal portions directly connected to the ESD circuit or adjacent to the ESD circuit.

14. The system of claim 10, wherein the first list comprises one or more metal portions having a width greater than a threshold.

15. The system of claim 10, wherein the first list comprises one or more metal portions having a via count greater than a threshold, wherein the via count is specified per a unit area.

16. A non-transitory computer readable medium comprising computer executable instructions for carrying out a method of designing an integrated circuit, the method comprising:
receiving a first list corresponding to at least one circuit component of a plurality of circuit components in a layout, wherein
the first list identifies a subset of the plurality of circuit components, and
the at least one circuit component comprises:
an electrostatic discharge (ESD) circuit;
an associated ESD current path; and
one or more first metal portions directly connected to the ESD circuit or adjacent to the ESD circuit;
generating a condensed layout from the layout by reducing a number of circuit components of the plurality of circuit components, wherein the condensed layout comprises the at least one circuit component; and
performing an ESD check of the condensed layout, wherein the ESD check is performed to verify compliance with one or more ESD design rules.

17. The non-transitory computer readable medium of claim 16, wherein the reducing the number of circuit components of the plurality of circuit components comprises removing a circuit component in the layout not identified in the first list.

18. The non-transitory computer readable medium of claim 16, wherein the first list comprises a second list including one or more layers of circuit elements identified in the first list; and
wherein the reducing the number of circuit components of the plurality of circuit components comprises removing one or more circuit components identified in the second list.

19. The non-transitory computer readable medium of claim 16, wherein the first list comprises a layer number on which the ESD circuit is located.

20. The non-transitory computer readable medium of claim 16, wherein the first list comprises one or more second metal portions having a via count greater than a first threshold, and the via count is less than a second threshold, wherein the first threshold is less than the second threshold.

* * * * *